United States Patent [19]

Stock et al.

[11] 4,097,329

[45] Jun. 27, 1978

[54] PROCESS FOR THE PRODUCTION OF MONOCRYSTALLINE SILICON RODS

[75] Inventors: Horst Stock, Burghausen; Adalbert Ellbrunner, Seibersdorf, both of Germany

[73] Assignee: Wacker-Chemitronic Gesellschaft für Elektronik Grundstoffe mbH, Burghausen, Germany

[21] Appl. No.: 722,236

[22] Filed: Sep. 13, 1976

[30] Foreign Application Priority Data

Oct. 27, 1975 Germany ............................ 2548046

[51] Int. Cl.² ............................................. B01J 17/18
[52] U.S. Cl. ..................... 156/617 SP; 156/DIG. 64; 23/273 SP
[58] Field of Search ............. 23/273 SP; 156/617 SP, 156/DIG. 64, 618, 619

[56] References Cited

U.S. PATENT DOCUMENTS

| | | | |
|---|---|---|---|
| 2,727,840 | 12/1955 | Teal | 156/617 SP |
| 2,962,363 | 11/1960 | Martin | 156/617 SP |
| 2,981,687 | 4/1961 | Parmee | 156/617 SP |
| 3,194,637 | 7/1965 | Longini | 156/617 SP |

*Primary Examiner*—Stephen J. Emery
*Attorney, Agent, or Firm*—Allison C. Collard

[57] ABSTRACT

A process for the production of a monocrystalline silicon rod by withdrawal from a silicon melt in a drawing chamber by means of a drawing spindle, comprises passing a stream of a protective gas, such as argon, into said chamber during the drawing operation and through a tube which surrounds the drawing spindle and the growing silicon rod, the chamber being maintained under reduced pressure.

2 Claims, 1 Drawing Figure

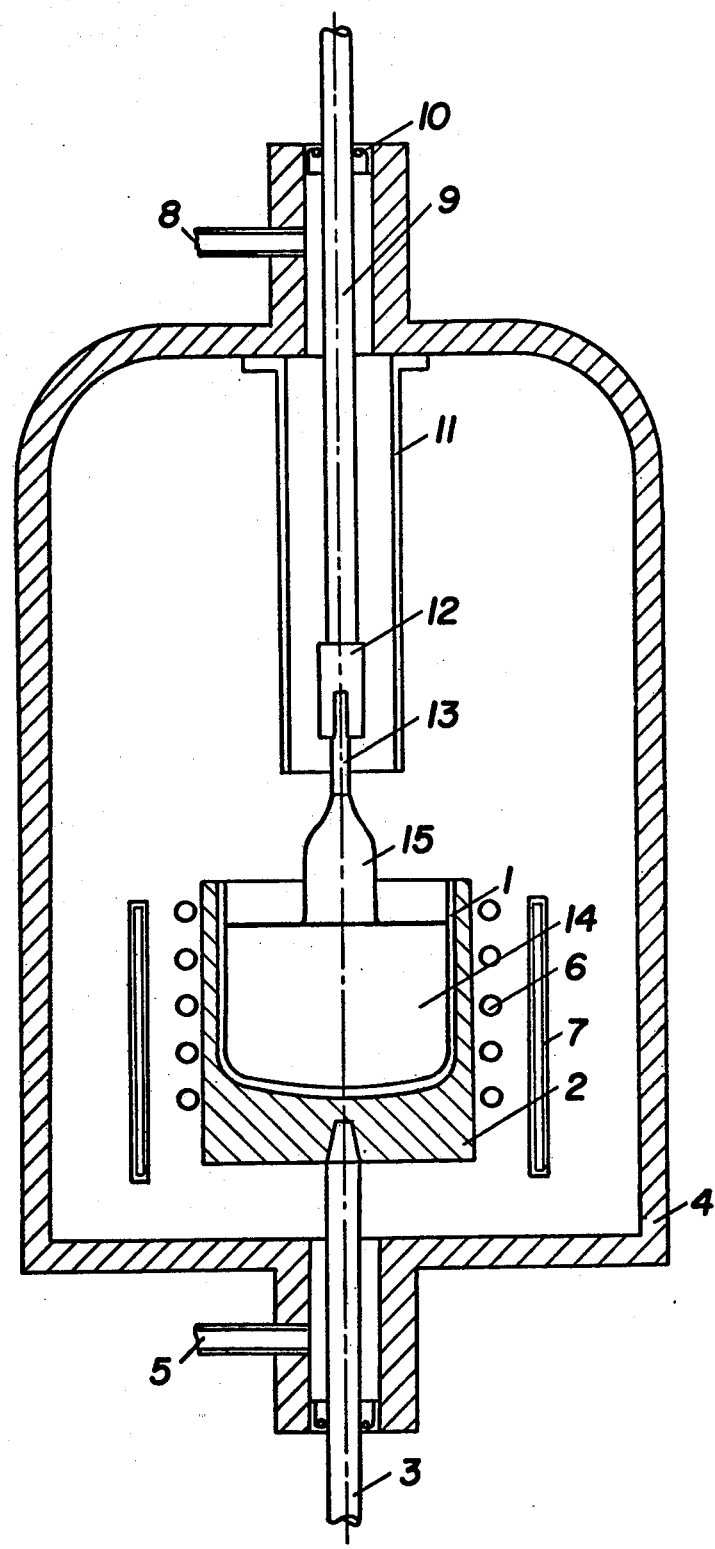

PROCESS FOR THE PRODUCTION OF MONOCRYSTALLINE SILICON RODS

The present invention relates to a novel process for the production of monocrystalline silicon rods by drawing from a silicon melt under reduced pressure in a protective gas atmosphere.

In drawing silicon monocrystals from melts in accordance with the known Czochralski process, volatile silicon monoxide is formed by the reaction of the silicon salt with the quartz crucible in which it is contained, which deposits on the cooler crucible wall, on the crystal, on the drawing spindle, and on the inner wall of the drawing chamber. During the upward movement of the drawing spindle deposited monoxide is stripped off the spindle by the sealing gasket, and drops into the melt below, producing growth defects in the surface of the member, leading to a sharp reduction in quality. Such growth defects, which can lead to a polycrystalline crystal growth, also occurs when silicon oxide agglomerates which form on the inner wall of the crucible, break off and fall into the melt.

Attempts have been made to avoid these mishaps by heating of the encrusted portions. This mode of operation is, however, only attainable for certain parts of the drawing apparatus, such as, for example, the crucible wall, so that the objective has remained mostly unfulfilled.

A principal object of the invention is to provide a process for the production of monocrystalline silicon rods by drawing from a melt, wherein disturbances due to the formation of silicon monoxide are avoided.

This object is achieved, in accordance with the invention, by passing a stream of a protective gas into the drawing chamber during the drawing operation and through a tube which concentrically surrounds the drawing spindle and the growing silicon rod.

The practice of the invention will be better understood by reference to the accompanying drawing, which illustrates a presently preferred arrangement for carrying out the process.

Referring to the drawing, there is shown generally a conventional apparatus for drawing of crystals from a melt, but including the additional improvement of the invention, and which is suitable for performing the process of the invention.

The apparatus comprises a quartz crucible 1, which is fitted into a graphite crucible 2, which is mounted on a spindle 3, which can be lowered along, or rotated about a vertical axis. The crucible 1 is filled with compacted pieces of polycrystalline silicon obtained, for example, during gas separation. The crucibles and other portions of the apparatus, to be described below, are positioned in the interior of a drawing chamber 4, which is hermetically sealed when in operation, and evacuated to a pressure of preferably $10^{-3}$ to $10^{-5}$ Torr via the gas removal member 5. Then the silicon is melted by means of a heating means 6, for example, a resistance heater, which is shielded around the outside by a radiation protective jacket 7, in an inert gas atmosphere, of, for example, hydrogen, helium or preferably argon.

The protective gas stream flows into the drawing chamber 9 through a gas inlet means 8 via a centrally located tube 11 made, for example, of alloy steel. The seeding crystal 13 held in support 12 at the lower end of the drawing chamber 9 is immersed under the surface of the melt 14 and withdrawn from the melt 14 at a suitable drawing velocity of about 1 to 5 mm/min. while rotating about its long axis at a speed, for example, of about 10 to 100 revolutions per minute.

During the drawing operation, a steady flow of protective gas is maintained through the drawing chamber 9 and the tube 11 concentrically surrounding the growing silicon rod 15 onto the melt surface. Protective gas removed via exit means 5 is pumped off in such a manner as to maintain the reduced pressure in vessel 4 of about 1 to 100 Torr.

The volume of the protective gas stream, e.g., hydrogen, helium, or preferably argon, depends mainly upon the amount of silicon, the size of the melt upper surface, or the size and surface area of the growing silicon rod 15, and will amount to between about 10 and 3,000 Nl/h, advantageously between 300 and 800 Nl/h in the case of the rod measurements currently in use, which are 30 to 100 mm diameter and about 800 to 1200 mm length.

These measures prevent the deposition upon the drawing spindle 9 of volatile silicon monoxide formed by the reaction of the melt 14 with the quartz crucible 1, and the consequent stripping of said deposit and its falling into the melt 1, by the upward movement of the drawing spindle 9 past the sealing gasket 10. In order to avoid at the same time that the silicon monoxide with its unfavorable consequences be deposited on the growing silicon rod 15 and on the inner wall of the quartz crucible 1, the tube 11 which is concentric with the drawing spindle 9 should be designed so that its lower end is about 80 to 500 mm, preferably from 150 to 350 mm above the upper surface of the silicon melt 14. The melt upper surface is preferably maintained at a constant height during the entire drawing operation, by adjusting the spindle 3 upon which the graphite crucible which carries the melt crucible 1 is supported.

The stream of protective gas flows over the surface of the drawing spindle 9 and the growing silicon rod 15, thence over the surface of the silicon melt 14, rising again along the inner wall of the quartz crucible, thereby bringing about the separation of silicon monoxide at these places. The major portion of the silicon monoxide is pumped off with the protective gas and leaves chamber 1 via the gas exit tube 5. The width of tube 11, or the hollow portion thereof, is so chosen that it provides an annular clearance for the tube 11 concentrically surrounding the growing silicon rod 15 corresponding to a radial width of 5 to 60 mm, preferably 15 to 35 mm. The tube 11 can be constructed, as mentioned previously, of alloy steel, as well as of other suitable materials, such as, for example, quartz, graphite, copper or silver.

The process of the invention is also suitable for the production of homogeneously doped silicon rods. The doping agent is added in known manner to the polycrystalline silicon either prior to or after melting. The process of the invention makes it possible to influence the amount of doping agent in the melt. This is accomplished by varying the pressure and/or the amount of the protective gas. By the controlled streaming of the gas over the surface of the melt, the vaporization of the doping agent can be accelerated and thereby the theoretical enrichment of the doping agent corresponding to the coefficient of distribution can be controlled. This effect is particularly favorable with difficulty volatilizable doping agents.

Thus, in accordance with the present invention, it is possible successfully to draw doped or undoped monocrystalline silicon rods of the highest quality, or great length, and large cross-section.

The following example, which is to be regarded as illustrative, and not as limiting, illustrates the practice of the invention.

EXAMPLE

A crucible drawing apparatus of the type shown in the drawing is charged with 15.5 kg of polycrystalline silicon which has been pretreated with phosphorus, and evacuated to about $10^{-4}$ Torr. By suitable regulation of the rate of protective gas introduction and withdrawal, there was established prior to the melting of the silicon and the drawing operation, a gas flow of 600 Nl/h at a pressure of about 15 Torr. The argon which was used as the protective gas flowed through the alloy steel tube surrounding the drawing spindle, said having an inside diameter of 12 cm, and thence into the drawing chamber. The distance between the surface of the melt and the lower end of the tube was about 300 mm. After immersing the seed crystal held at the lower end of the drawing spindle into the surface of the melt of silicon which was kept in molten state by resistance heating, the spindle was withdrawn at a drawing velocity of 2 mm/min., and rotation of 15 rpm about the crystal axis, thereby forming a monocrystalline silicon rod homogeneously doped with phosphorus, having a cylinder length of 1200 mm, a diameter of 80 mm and a weight of 15.5 kg.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. In a Czochralski process for the production of a monocrystalline silicon rod of the type wherein the rod is vertically withdrawn from a silicon melt in a single drawing chamber under reduced pressure by means of a vertically-movable drawing spindle which is at least partially disposed within said chamber and which is slidably received within a concentrically-arranged sealing gasket mounted on said chamber to enhance hermetic sealing thereof, the improvement comprising:
   passing a stream of protective gas into said chamber during the drawing operation by introducing it into the open, upper end of a vertically disposed tube of substantial length which is mounted within said chamber above said melt and which concentrically surrounds the drawing spindle and the growing silicon rod and has a radial width of about 5 to 60mm to provide sufficient annular clearance and which has a lower, open end which is between 150 and 350 mm above the surface of the melt such that the protective gas flows along the spindle and silicon rod in the direction of the melt surface, so as to prevent diffusion of reaction gases from the melt to the spindle surface and subsequent deposition thereon which, in turn, would be stripped therefrom by said sealing gasket and fall into the melt therebelow, said protective gas being passed through said chamber in an amount between 300 and 800 Nl/hour and said drawing operation taking place at a reduced pressure of between 1 and 100 Torr.

2. The process according to claim 1, in which the protective gas is argon.

* * * * *